United States Patent
Freestone et al.

(10) Patent No.: US 12,227,313 B2
(45) Date of Patent: Feb. 18, 2025

(54) FOLD-OUT SATELLITE WITH INTEGRATED RADIATOR PANEL

(71) Applicant: Maxar Space LLC, Palo Alto, CA (US)

(72) Inventors: Michael Freestone, Woodside, CA (US); Joel Boccio, Palo Alto, CA (US)

(73) Assignee: Maxar Space LLC, Palo Alto, CA (US)

( * ) Notice: Subject to any disclaimer, the term of this patent is extended or adjusted under 35 U.S.C. 154(b) by 670 days.

(21) Appl. No.: 17/538,161

(22) Filed: Nov. 30, 2021

(65) Prior Publication Data

US 2023/0166871 A1    Jun. 1, 2023

(51) Int. Cl.
| | | |
|---|---|---|
| *B64G 1/50* | (2006.01) | |
| *B64G 1/22* | (2006.01) | |
| *B64G 1/44* | (2006.01) | |
| *H05K 7/20* | (2006.01) | |

(52) U.S. Cl.
CPC ............. *B64G 1/503* (2013.01); *B64G 1/222* (2013.01); *B64G 1/443* (2013.01); *B64G 1/506* (2013.01); *H05K 7/20336* (2013.01)

(58) Field of Classification Search
CPC ........ B64G 1/22; B64G 1/222; B64G 1/2221; B64G 1/503; B64G 1/2226; B64G 1/2229; B64G 1/506; B64G 1/443; H05K 7/20336
See application file for complete search history.

(56) References Cited

U.S. PATENT DOCUMENTS

| | | | | | |
|---|---|---|---|---|---|
| 4,811,034 | A | * | 3/1989 | Kaminskas | F24S 23/71 343/915 |
| 4,815,525 | A | * | 3/1989 | Readman | B64G 1/503 244/172.6 |
| 4,832,113 | A | * | 5/1989 | Mims | B64G 1/2229 165/41 |
| 5,027,892 | A | * | 7/1991 | Bannon | B64G 1/503 244/172.6 |
| 5,682,943 | A | * | 11/1997 | Yao | B64G 1/58 165/104.21 |
| 5,743,325 | A | * | 4/1998 | Esposto | F28D 15/0266 165/41 |
| 5,794,890 | A | * | 8/1998 | Jones, Jr. | F28D 15/0275 16/280 |
| 5,806,800 | A | * | 9/1998 | Caplin | B64G 1/503 165/41 |
| 6,378,809 | B1 | * | 4/2002 | Pon | B64G 1/503 244/172.7 |
| 6,543,724 | B1 | * | 4/2003 | Barnett | B64G 1/2229 244/172.6 |
| 6,568,638 | B1 | * | 5/2003 | Capots | B64G 1/2224 244/159.4 |

(Continued)

*Primary Examiner* — Richard Green
*Assistant Examiner* — Michael A. Fabula
(74) *Attorney, Agent, or Firm* — Pearl Cohen Zedek Latzer Baratz LLP

(57) ABSTRACT

A satellite includes a first radiator panel with first heat-generating components attached to its surface and a second radiator panel with second heat-generating components attached to its surface. One or more actuators are configured to deploy the first and second radiator panels from a compact configuration in which the first and second radiator panels are overlapping to a deployed configuration in which the first and second radiator panels are non-overlapping.

20 Claims, 12 Drawing Sheets

(56) References Cited

U.S. PATENT DOCUMENTS

| | | | |
|---|---|---|---|
| 6,776,220 B1* | 8/2004 | Low | B64G 1/50 |
| | | | 165/41 |
| 9,331,394 B2* | 5/2016 | Toledo | H01Q 15/162 |
| 9,889,951 B1* | 2/2018 | Wong | F28D 15/0275 |
| 10,018,426 B2* | 7/2018 | Aston | B64G 1/503 |
| 10,780,998 B1* | 9/2020 | Wu | B64G 1/58 |
| 11,492,145 B2* | 11/2022 | Kawamura | B64G 1/44 |
| 11,760,510 B1* | 9/2023 | Wu | B64G 1/2224 |
| | | | 244/171.7 |
| 12,006,071 B1* | 6/2024 | Allison | E05D 3/02 |
| 2005/0023415 A1* | 2/2005 | Walker | B64G 1/222 |
| | | | 244/172.6 |
| 2010/0019093 A1* | 1/2010 | Russell | B64G 1/66 |
| | | | 244/171.8 |
| 2013/0233516 A1* | 9/2013 | Aston | F28D 15/02 |
| | | | 165/104.21 |
| 2014/0224939 A1* | 8/2014 | Wong | B64G 1/503 |
| | | | 165/104.26 |
| 2015/0367964 A1* | 12/2015 | Judd | B64G 1/10 |
| | | | 244/158.1 |
| 2016/0297551 A1 | 10/2016 | Cael | |
| 2019/0329912 A1 | 10/2019 | Kawamura | |
| 2020/0102099 A1 | 4/2020 | Busche | |
| 2020/0191497 A1* | 6/2020 | Hulse | B64G 1/503 |
| 2020/0239164 A1 | 7/2020 | Kalman | |
| 2021/0180872 A1 | 6/2021 | O' Coin et al. | |
| 2021/0303290 A1 | 9/2021 | Schmit et al. | |
| 2022/0073217 A1* | 3/2022 | Iverson | B64G 1/2224 |

\* cited by examiner

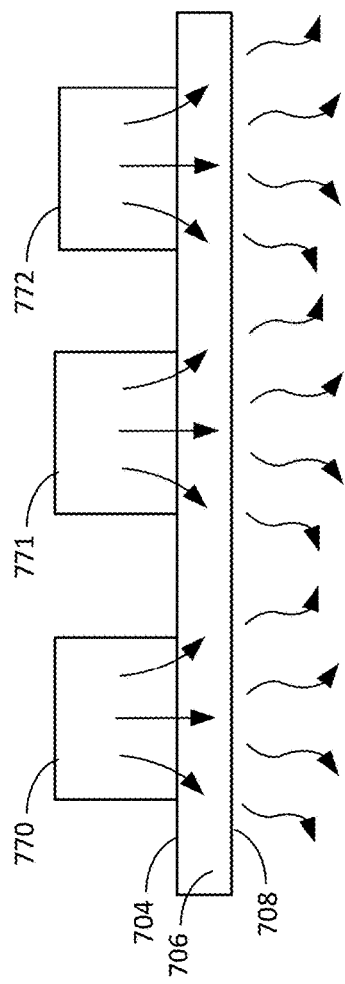
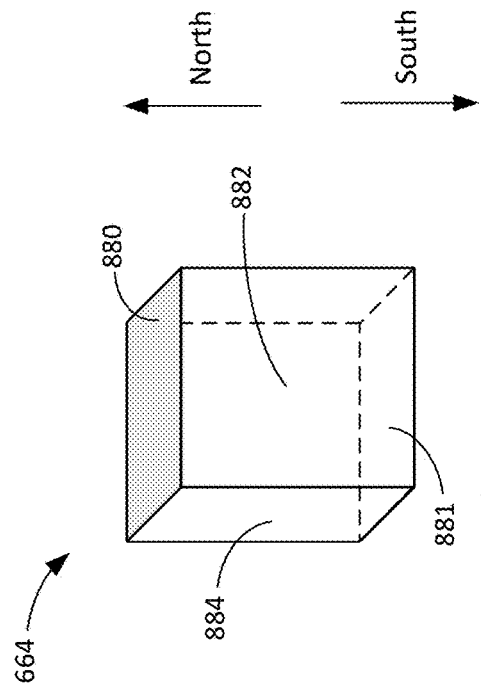
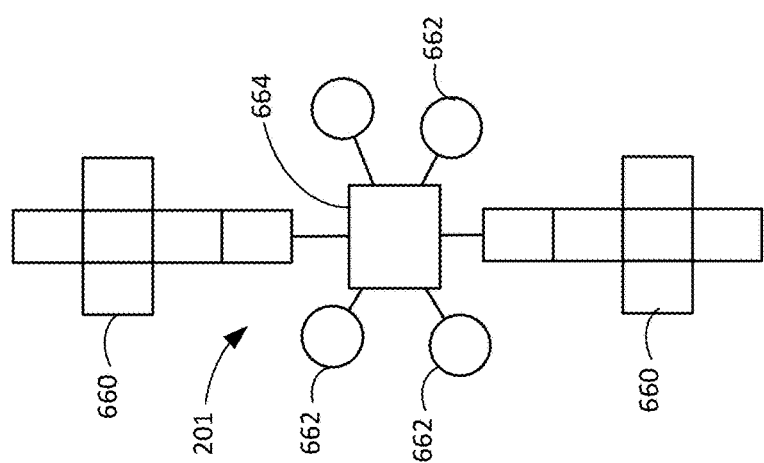

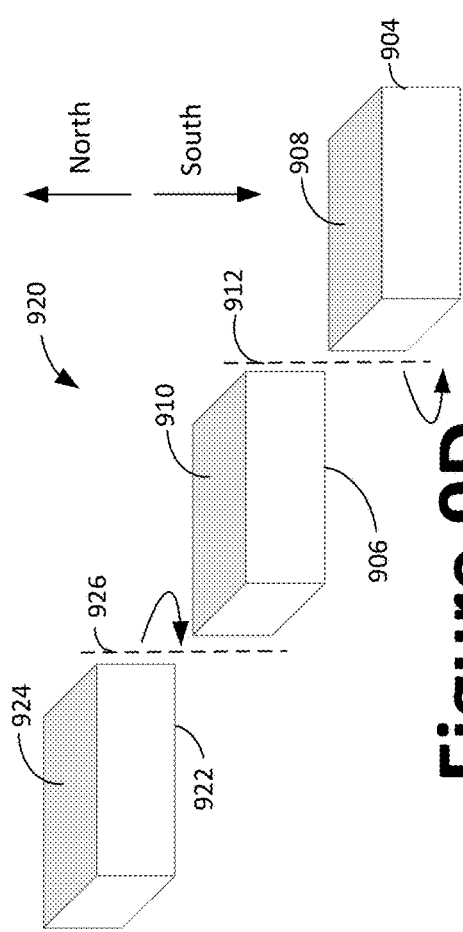
Figure 9C
Figure 9D
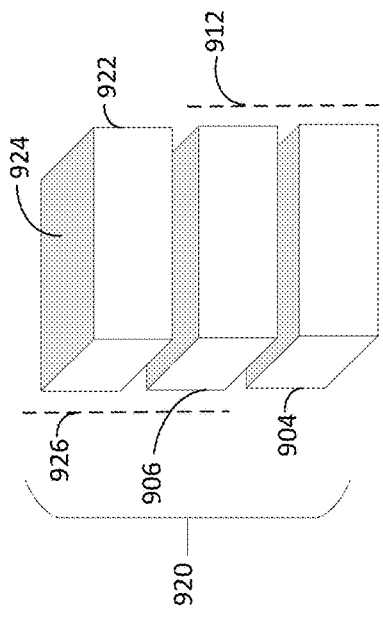
Figure 9A
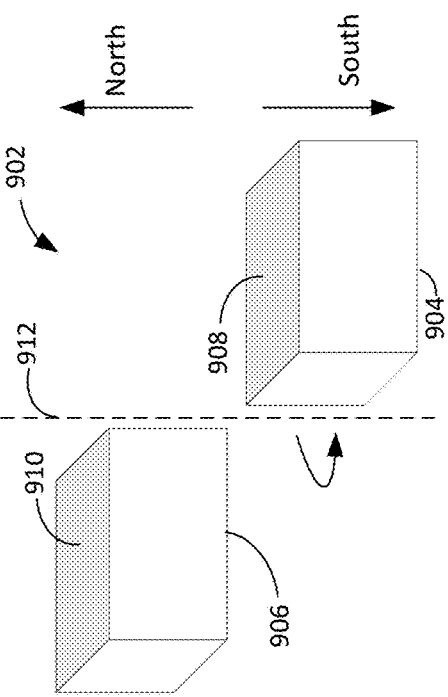
Figure 9B

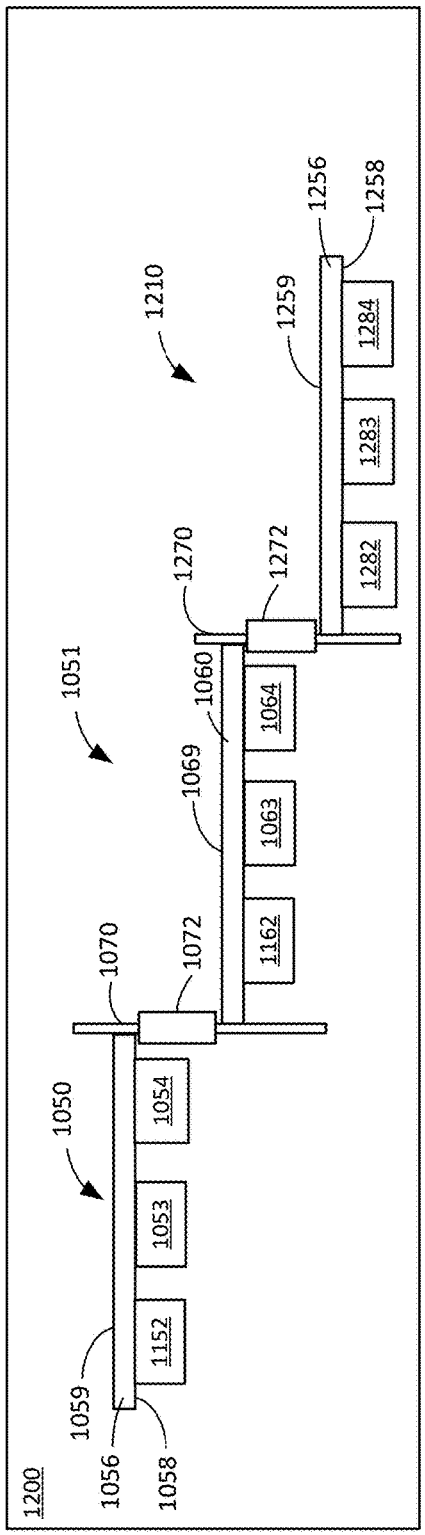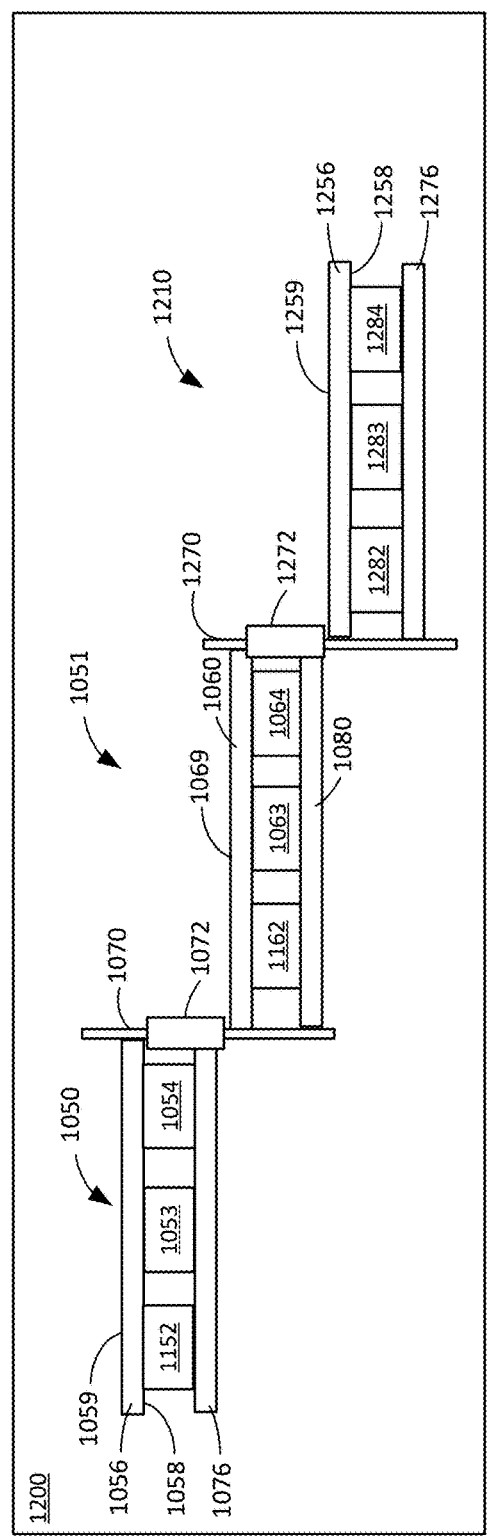

FOLD-OUT SATELLITE WITH INTEGRATED RADIATOR PANEL

BACKGROUND

The present disclosure relates to satellite technology.

Satellite communication systems typically include one or more satellites and a set of ground terminals. Such systems typically operate within regulations that allocate operating frequency bandwidth for a particular communications service. Satellites with embedded digital telecommunications payloads can provide advanced features such as reconfigurable switching, beamforming or beam hopping with a high degree of flexibility. However, circuits implementing these, and other features may generate significant heat, which may be problematic. If heat is not adequately managed, temperature of satellite components may rise to unacceptable levels, which may affect operation. Managing heat in space is generally more challenging than other environments (e.g., on or under land, in air, or in water). Designing a satellite to accommodate a substantial digital payload and the heat it may generate while minimizing costs and resources such as mass and size is a challenging task.

BRIEF DESCRIPTION OF THE DRAWINGS

FIG. 6 shows an example satellite including a central body.

FIG. 7 illustrates heat-generating components attached to a radiator panel.

FIG. 8 illustrates orientation of radiator panels of a satellite.

FIGS. 9A-D show examples of fold-out satellites.

FIGS. 12A-B show examples of satellites with three sections.

DETAILED DESCRIPTION

Figure 1:
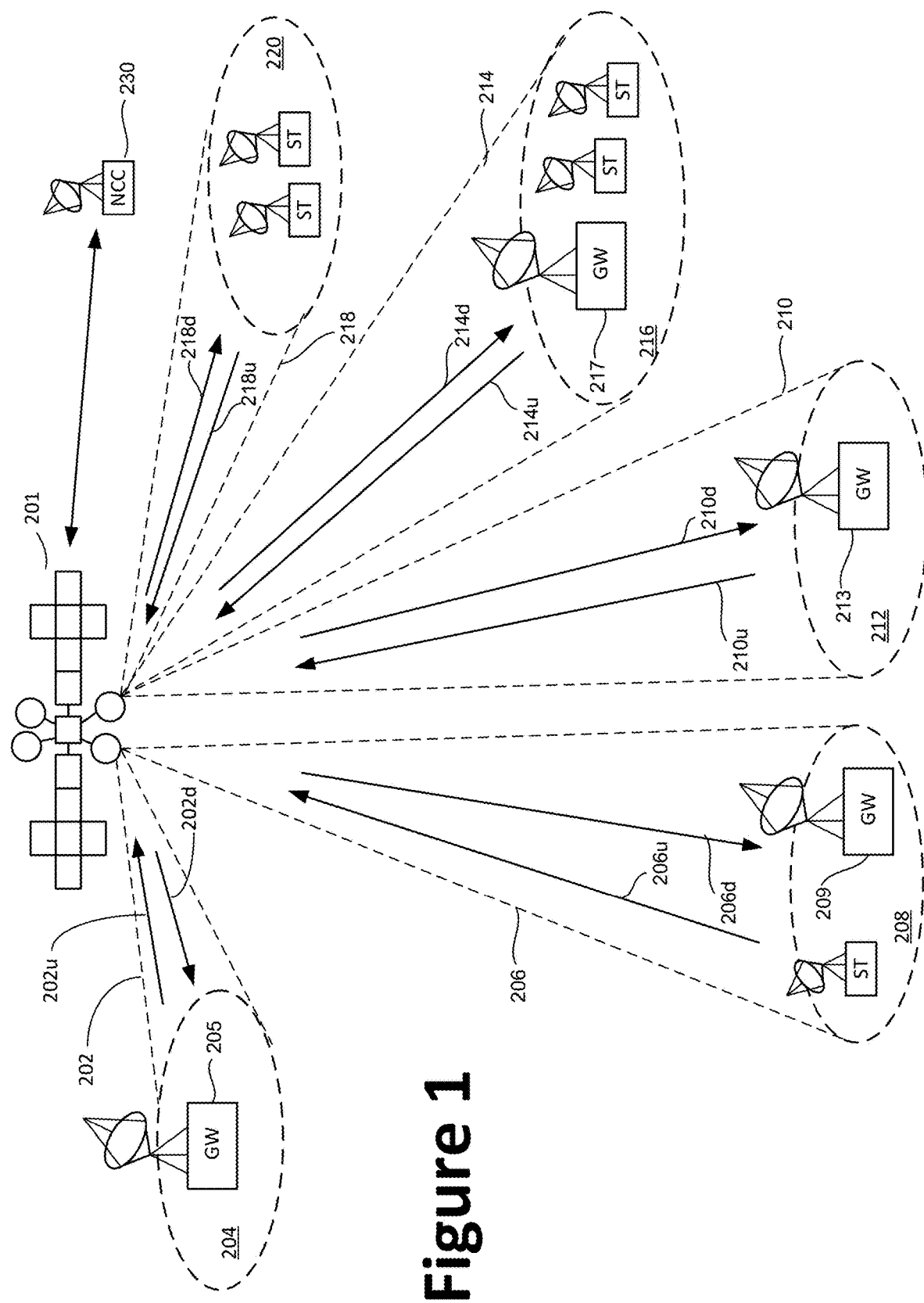
FIG. 1 is a block diagram describing one embodiment of a portion of a satellite communications system.

Aspects of the present technology may be applied to satellites used for various purposes including but not limited to communication. In many satellites, including satellites used for digital communication (e.g., including a digital channelizer and/or other digital circuits), significant heat may be generated by electronic components (e.g., amplifiers and other components). Such heat-generating components may be attached to radiator panels in a manner that enables efficient heat transfer from heat-generating components to radiator panels from which it is radiated into space. In an example, heat-generating components of a satellite are mounted on two or more radiator panels that may have a compact (e.g., folded) overlapping configuration for launch and may then be deployed when in space. In a deployed configuration the panels may be extended (e.g., unfolded) so that they are non-overlapping to allow efficient radiation from each panel. In some examples, heat-generating components may be sandwiched between a pair of radiator panels for increased heat radiating area.

System Overview

Aspects of the present technology may be implemented in a single satellite or in multiple satellites (e.g., in a satellite communication system). A satellite communication system may include a single satellite or a constellation of geostationary or non-geostationary satellites orbiting the Earth, a plurality of gateways and a plurality of subscriber terminals (also referred to as terminals). The subscriber terminals communicate with the gateways or with other terminals via the satellites. The system can be used to provide access to the Internet or other network, telephone services, video conferencing services, private communications, broadcast services, as well as other communication services.

In general, each satellite provides a plurality of receive and transmit beams which may be formed by analog means such as non-articulated or steerable spot beam antenna, or by analog beamforming networks at the input or output sides of the satellite operating on antenna element signals. The entirety or portions of the spectrum covered by receive beams (receive sub-bands) are routed to the entirety or portions of the spectrum covered by transmit beams (transmit sub-bands). This routing is traditionally performed by analog means (bent pipe payloads). Alternatively, on-board processing can be used to flexibly assign receive sub-bands to transmit sub-bands using a digital channelizer system, which may or may not include beam hopping schemes. Additionally, the digital channelizer system may also be used to form the beams digitally, in which case it will receive as input an array of receive antenna element signals and output an array of transmit antenna element signals. Mixed operating modes are also possible where some of the beams are formed analogically and other beams are formed digitally. Any given beam may also be formed by a combination of analog and digital means (partial analog beamforming).

A digital channelizer allows data from multiple receive modules (receive circuits) to be routed to one or more switch modules (switch circuits), which route data to multiple transmit modules (transmit circuits). The switch modules optionally integrate the circuits to implement digital beamforming, in which case they may also be referred to as "beamforming switch modules (beamforming switch circuits)". A receive module may include a frequency demultiplexer to generate input subchannels from an input and a time-division demultiplexer to demultiplex input subchannels by sample periods and provide different time-division outputs for different time periods.

FIG. 1 is a block diagram depicting a portion of a satellite communications system that includes one or more satellites. FIG. 1 depicts satellite 201, which may be a geostationary satellite or a non-geostationary satellite. A geostationary satellite moves in a geosynchronous orbit (having a period of rotation synchronous with that of the Earth's rotation) in the plane of the Equator, so that it remains stationary in relation to a fixed point on the Earth's surface. This orbit is often achieved at an altitude of 22,300 miles (35,900 km) above the earth; however, other altitudes can also be used. A non-geostationary satellite is a satellite that is not a geostationary satellite and is not in an orbit that causes the satellite to remain stationary in relation to a fixed point on the Earth's surface. Examples of non-geostationary satellites include (but are not limited to) satellites in Low Earth Orbits ("LEO"), Medium Earth Orbits ("MEO") or Highly Elliptical Orbits ("HEO"). Although FIG. 1 only shows one satellite, in some embodiments the system will include multiple satellites that are referred to as a constellation of satellites, which may communicate with each other.

In one embodiment, satellite 201 comprises a bus (i.e., spacecraft) and one or more payloads, including a communications payload. The satellite may also include multiple power sources, such as batteries, solar panels, and one or more propulsion systems, for operating the bus and the payload. The satellite includes an antenna system that provides a plurality of beams, including non-articulated and steerable spot beams, for communicating with subscriber terminals, gateways and/or other satellites.

A subscriber terminal is a device that wirelessly communicates with a satellite, usually to be used by one or more end users. The term subscriber terminal may be used to refer to a single subscriber terminal or multiple subscriber terminals. A subscriber terminal is adapted for communication with the satellite communication system including satellite 201. Subscriber terminals may include fixed and mobile subscriber terminals including, but not limited to, a cellular telephone, wireless handset, a wireless modem, a data transceiver, a paging or position determination receiver, or mobile radio-telephone, a cellular backhaul, a trunk, an enterprise computing or storage device, an airborne device, a maritime device or a head end of an isolated local network. A subscriber terminal may be hand-held, portable (including vehicle-mounted installations for cars, trucks, boats, trains, planes, etc.) or fixed as desired. A subscriber terminal may be referred to as a wireless communication device, a mobile station, a mobile wireless unit, a user, a subscriber, a terminal or a mobile.

The term gateway may be used to refer to a device that communicates wirelessly with a satellite and provides an interface to a network, such as the Internet, a wide area network, a telephone network or other type of network. In some embodiments, gateways manage the subscriber terminals.

FIG. 1 also shows a Network Control Center 230, which includes an antenna and modem for communicating with satellite 201, as well as one or more processors and data storage units. Network Control Center 230 provides commands to control and operate satellite 201, as well as all other satellite communication payloads in the constellation. Network Control Center 230 may also provide commands to any of the gateways (via a satellite or a terrestrial network) and/or subscriber terminals.

In one embodiment, satellite 201 is configured to provide two hundred fixed (i.e., non-articulated so that they are fixed in relation to satellite 201) spot beams that use time domain beam hopping among the spot beams. In other embodiments, more or less than two hundred spot beams can be used for the time domain beam hopping. In one embodiment, the two hundred hopping beams are divided into thirty-six hopping groups such that one beam in each group is active at a given time; therefore, thirty-six of the two hundred spot beams are active at an instance in time. In addition to the two hundred non-articulated spot beams that perform time domain beam hopping, one embodiment of satellite 201 includes eight 4.2 degree steerable spot beams used to communicate with gateways. In other embodiments, more or less than eight can be used. Additionally, satellite 201 includes six 2.8 degree steerable spot beams which can have a dual purpose of communicating with gateways and/or providing high capacity communication for subscriber terminals that would otherwise fall under the hopping beams of the two hundred spot beams performing time domain beam hopping. Other embodiments can use different sized spot beams.

For example purposes only, FIG. 1 shows five spot beams: 202, 206, 210, 214 and 218. Spot beam 202 is a 4.2 degree steerable spot beam that illuminates coverage area 204 for communicating with one or more gateways 205 via downlink 202d and uplink 202u. Spot beam 206 is a 2.8 degree steerable dual-purpose beam that illuminates coverage area 208 in order to communicate with one or more gateways 209 and one or more subscriber Terminals ST via downlink 206d and uplink 206u. Spot beam 210 is a 2.8 degree steerable spot beam that could be used to communicate with gateways and/or subscriber terminals ST, but in the example of FIG. 1 spot beam 210 illuminates coverage area 212 to communicate with one or more gateways 213 via downlink 210d and uplink 210u. The two hundred spot beams that perform time domain beam hopping can be used to communicate with subscriber terminals and/or gateways. Spot beams 214 and 218 are two examples of the two hundred non-articulated spot beams that performed time domain beam hopping. Spot beam 214 illuminates coverage area 216 to communicate with one or more gateways 217 and one or more subscriber terminals ST via downlink 214d and uplink 214u. Spot beam 218 illuminates coverage area 220 to communicate with subscriber terminals ST via downlink 218d and uplink 218u.

Figure 2:
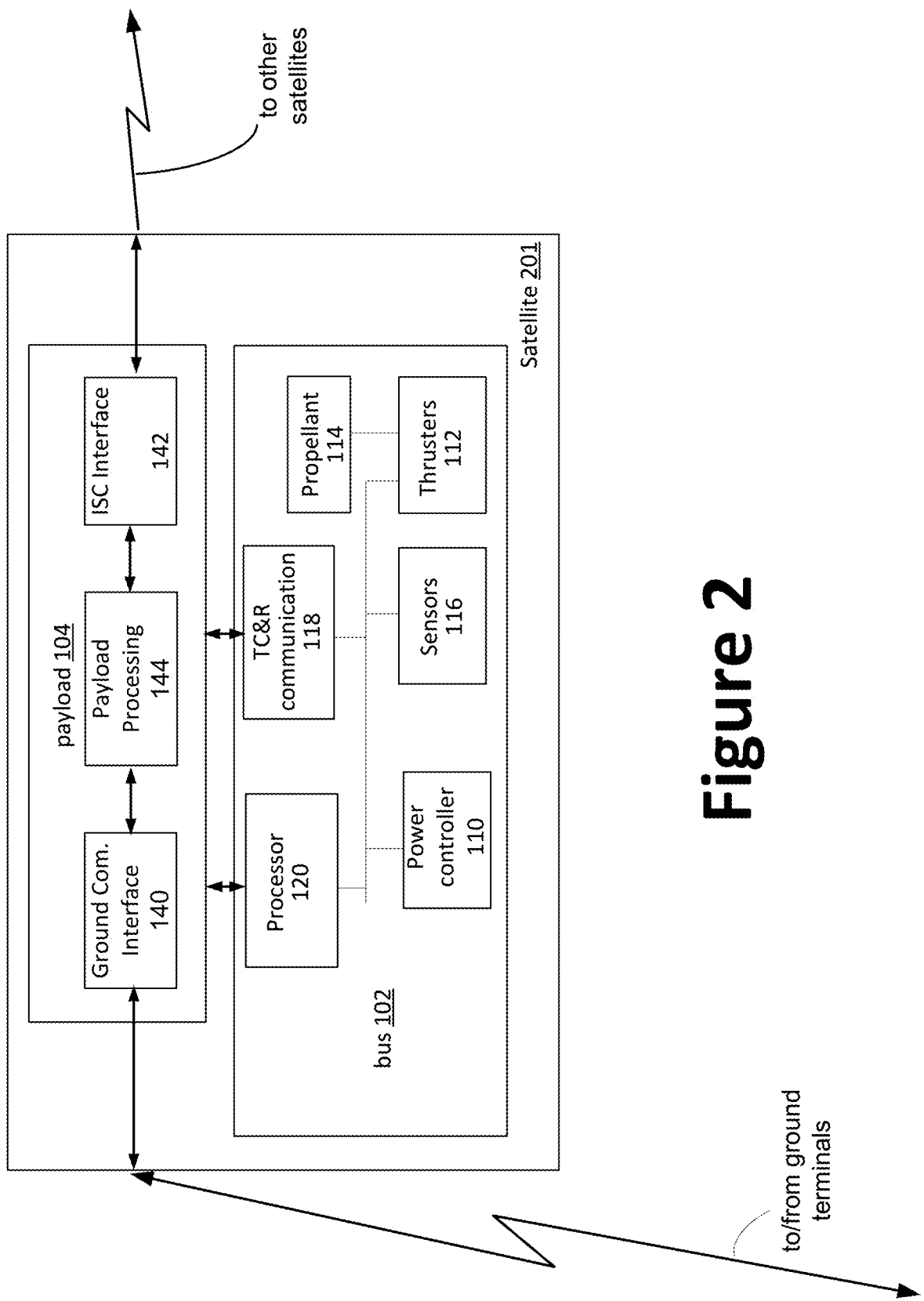
FIG. 2 is a block diagram depicting a satellite including a bus and payload.

FIG. 2 is a block diagram of one embodiment of satellite 201 of FIG. 1. In one embodiment, satellite 201 includes a bus 102 and a payload 104 carried by bus 102. Some embodiments of satellite 201 may include more than one payload. The payload provides the functionality of the communication and/or processing systems described herein.

In general, bus 102 is the spacecraft that houses the payload. For example, the bus components include a power controller 110, which may be connected to solar panels and one or more batteries (not shown in FIG. 2) to provide power to other satellite components; thrusters 112; propellant 114; sensors 116; telemetry, command and ranging (T, C & R) communication and processing equipment 118; and processor 120. Other equipment can also be included. Solar panels, batteries and power controller 110 are used to provide power to satellite 100. Thrusters 112 are used for changing the position or orientation of satellite 100 while in space. Propellant 114 is for the thrusters. Sensors 116 are used to determine the position and orientation of satellite 100. T, C & R communication and processing equipment 118 includes communication and processing equipment for telemetry, commands from the ground to the satellite and ranging to operate the satellite. Processor 120 is used to control and operate satellite 201. An operator on the ground can control satellite 201 by sending commands via T, C & R communication and processing equipment 118 to be executed by system processor 120. Some embodiments include a Network Control Center that wirelessly communicates with T, C & R communication and processing equipment 118 to send commands and control satellite 201. In one embodiment, processor 120 and T, C & R communication and processing equipment 118 are in communication with payload 104. In general, electronic components of bus 102 (e.g., processor 120, TC&R communication and processing equipment 118 and power controller 110) generate heat (e.g., due to resistive heating effects) and may be considered heat-generating components.

In one embodiment, the payload 104 includes an antenna system (not depicted in FIG. 2) that provides a set of one or more beams (e.g., spot beams) comprising a beam pattern used to receive wireless signals from ground stations and/or other satellites, and to send wireless signals to ground stations and/or other satellites. In one example, an entire service region is covered using one beam. In another example, however, the antenna system provides a beam pattern that includes multiple spot beams, with each spot beam covering a portion of the service region. The portion of the service region covered by a spot beam is referred to as a cell. The individual spot beams divide an overall service region into a number of cells. In one embodiment, the antenna system includes a phased array antenna, a direct radiating antenna, or a multi-feed fed reflector.

Payload 104 also includes payload components such as Ground Communication Interface 140, Inter-satellite Communication Interface 142 and Payload Processing System 144. Ground Communication Interface 140, which is connected to the antenna system (not depicted), is configured to communicate with one or more ground terminals (e.g., send and receive messages to/from gateways and/or subscriber terminals). Inter-satellite Communication Interface 142, which is connected to the antenna system, is configured to communicate with other satellites, e.g., via an in-space network. In general, electronic components of payload 104 (e.g., ground communication interface 140, payload processing system 144 and Inter-satellite communication interface 142) generate heat when in use and may be considered heat-generating components.

Figure 3:
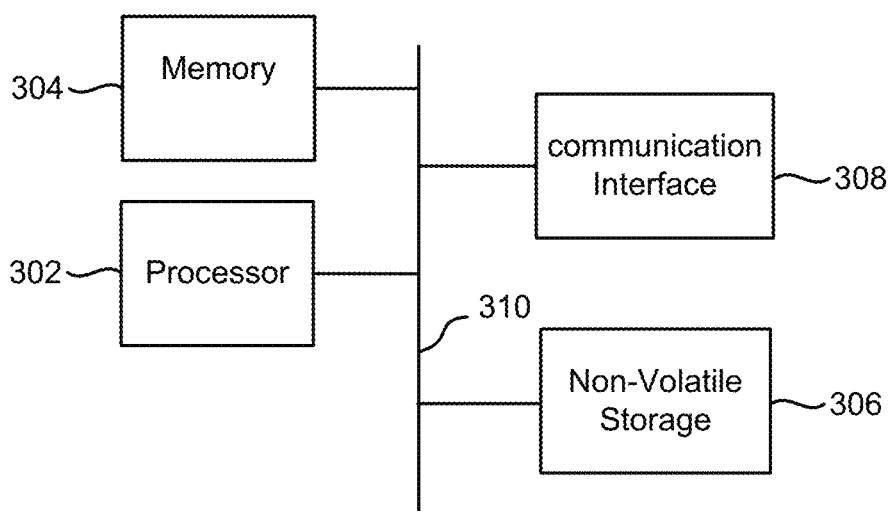
FIG. 3 depicts an example of a payload processing system.

FIG. 3 is a block diagram of one example embodiment of a computing system that can be used to implement Payload Processing System 144. The computer system of FIG. 3 includes a processor 302, main memory 304, non-volatile storage 306, and communication interface 308. Processor 302 may contain a single microprocessor or may contain a plurality of microprocessors for configuring the computer system as a multi-processor system. Main memory 304 stores, in part, instructions and data for execution by processor 302. In embodiments where the proposed technology is wholly or partially implemented in software, main memory 304 can store the executable code when in operation. Main memory 304 may include banks of dynamic random access memory (DRAM) as well as high speed cache memory. Non-volatile storage 306 stores data and instructions for use by processor 302. In one embodiment, non-volatile storage 306 stores the system software for implementing the proposed technology for purposes of loading to main memory 304. Non-volatile storage 306 may be implemented with a magnetic disk drive, an optical disk drive, a solid state drive, and/or other forms of flash memory. Communication interface 308 cans be any type of electrical and/or optical apparatus for enabling and managing communication, including a network interface for connecting the computer system to a network, a modem, a router, etc. For purposes of simplicity, the components shown in FIG. 3 are depicted as being connected via a single bus 310. However, the components may be connected through one or more data transport means. For example, processor 302 and main memory 304 may be connected via a local microprocessor bus, and non-volatile storage 306 and communication interface 308 may be connected via one or more input/output (I/O) buses.

Figure 4:
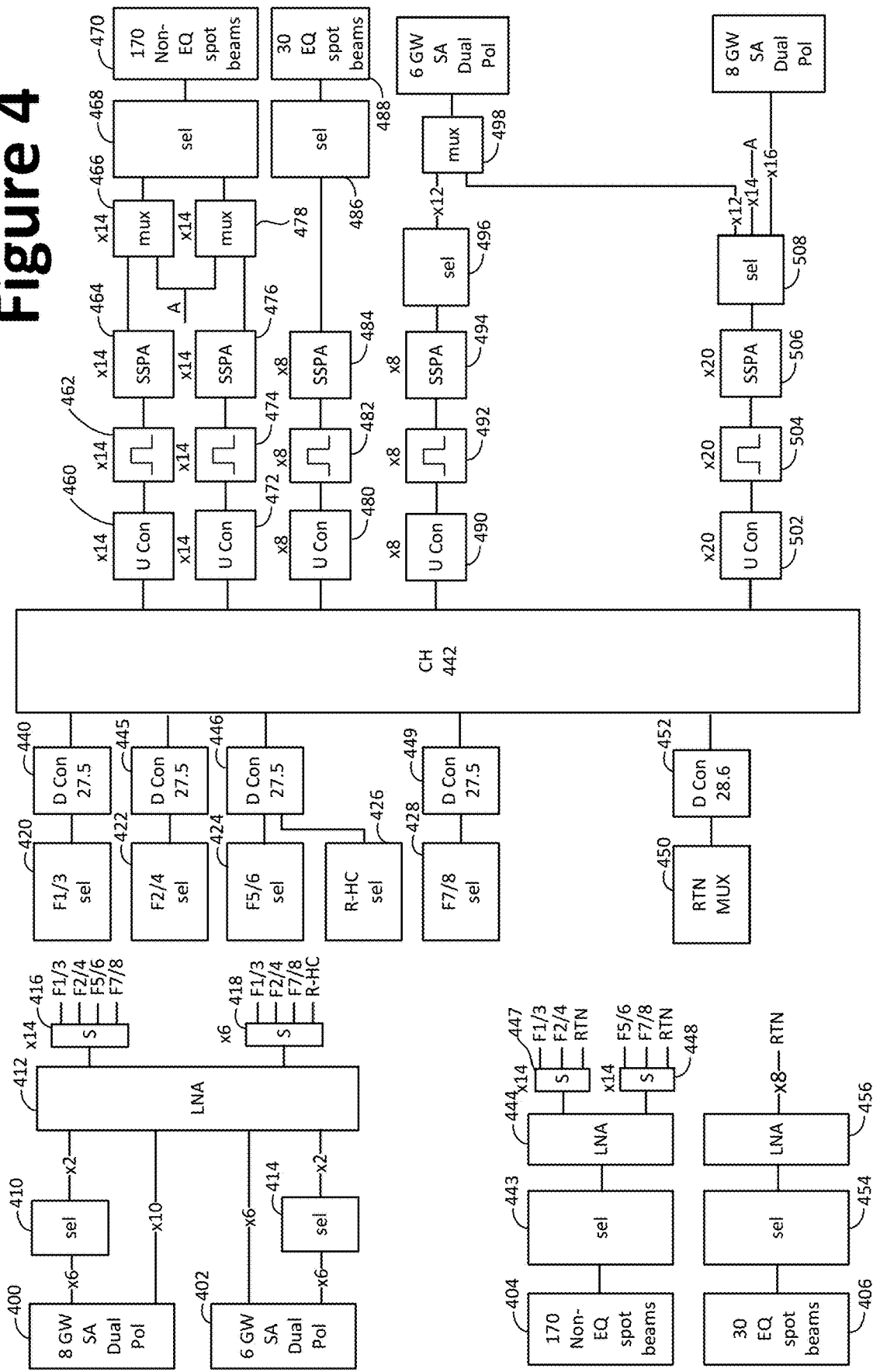
FIG. 4 shows an example of a communications payload that includes a digital channelizer.

FIG. 4 is a block diagram of one embodiment of circuits of a communications payload (e.g., payload 104) for non-geostationary satellite such as satellite 201. Traditionally, the communications path from the gateway to the subscriber terminal via the satellite is referred to as the forward path and the communications path from the subscriber terminals to the gateway via the satellite are referred to as the return path. When a satellite is used to provide connectivity to the Internet, a user at a computer connected to a subscriber terminal will send a request for content on the Internet to the gateway via the satellite, and the gateway will provide, in response to that request, access onto the Internet. The response from the Internet will be provided to the gateway, and then forwarded onto the subscriber terminal via the satellite.

The structure of FIG. 4 implements both the forward path and the return path. The uplink beams are received at the left-hand portion of the components of FIG. 4 and the downlink beams are provided at the right-hand edge of the components of FIG. 4. For example, FIG. 4 shows eight gateway steerable dual polarization antennas 400 and six gateway/high capacity subscriber terminal steerable antennas 402 with dual polarization for receiving uplink beams. FIG. 4 also shows the two hundred non-articulated spot beams divided into two groups: one hundred and seventy spot beams 404 illuminating areas away from the Equator and thirty spot beams 406 illuminating areas at the Equator.

The eight 4.2 degree gateway steerable spot beam antennas 400 provide sixteen signals, eight in each polarization (left hand/right hand or horizontal/vertical). Six of those sixteen signals are provided to selection matrix 410 which includes a set of switches that selects two of the six input signals and provides those two selected signals to low noise amplifier 412. Ten of the 16 dual polarization signals from antennas 400 are applied directly to low noise amplifier bank 412 comprising low noise amplifiers. The six gateway steerable antennas 402 provide 12 signals (six signals in two polarizations). Six of those signals are provided directly to low noise amplifier bank 412, the other six signals are provided to a 6:2 selection matrix 414, which chooses two of the signals to provide to low noise amplifier bank 412. Note that the satellite payload will include a processor (e.g., processor 120, not depicted in FIG. 4) which controls each of the selection matrices described herein. Alternatively, satellite bus 102 may include a processor (e.g., processor 120) that may control the selection matrices. As described above, low noise amplifier bank 412 has 20 input signals and therefore has 20 output signals. Fourteen of the signals output from low noise amplifier bank 412 are provided to separate splitters 416. That is, there are 14 splitters 416. Each splitter splits the incoming signal into four copies noted as: F1/3, F2/4, F5/6 and F7/8. The other six outputs from LNA 412 are provided to a different set of splitters 418 that split the signal to four copies labeled as: F1/3, F2/4, F7/8 and R-HC. The seven outputs of the splitter that started with an F are part of the forward path. The one output of the splitter 418 that is labeled R-HC is part of the return path from a steerable high capacity spot beam used to connect to subscriber terminals. In one embodiment splitters 416 and 418 include filters for passing the frequency bands of the labeled output and stopping all other frequencies.

After the splitters 416 and 418, the signals are sent to appropriate matrices 420, 422, 424, 426 and 428 in order to select which bands to use. Selection matrix 420 receives the signal F1/3. Selection matrix 422 receives signal F2/4. Selection matrix 424 receives signal F5/6. Selection matrix 426 receives signal R-8C. Selection matrix 428 receives F7/8. Eleven signals of the output of selection matrix 420 are provided to down converter 440, which provides its output to channel 442. The 11 signals of the output of selection matrix 422 are provided to down converter 445, which provided its output to channelizer 442. The output of selection matrix 424 includes seven signals that are provided to down converter 446, which provides its output to channelizer 442. The output of selection matrix 426 includes six signals that are provided to down converter 446, which provides its output to channelizer 442. The output of selection matrix 428 includes 11 signals that are provided to down converter 449, which provides its output to channelizer 442. Each of the selection matrices includes a series of programmable switches to route a subset of inputs to the output ports.

The one hundred and seventy non-Equatorial spot beams 404 are provided to selection matrix 443 which chooses twenty-eight out of the one hundred and seventy spot beams. That is, one beam from each of 28 beam hopping groups (discussed below) is chosen. Those 28 signals are sent to low noise amplifier 444. Half of the signals output from low noise amplifier 444 are provided to splitters 447. The other half of the signals are provided to splitters 448. Each of the fourteen splitters 447 make three copies of the signal and output those three copies as F1/3, F2/4 and RTN. Each of the fourteen splitters 448 make three copies of their respective incoming signals and output them F5/6, F7/8 and RTN. Note that the signals F1/3, F2/4, F5/6 and F7/8 are part of the forward path representing communication from a gateway in one of the one hundred and seventy hopping beams. The signal RTN is part of the return path, from subscriber terminals. Note that in some embodiments, each of the splitters has appropriate band pass filters. In some embodiments, each of the selection matrices has appropriate band pass filters at respective inputs and/or outputs.

FIG. 4 shows the thirty non-articulated beam hopping spot beams near the Equator being provided to selection matrix 454. The eight selected signals are provided to low noise amplifier 456 which outputs a signal labeled RTN. Note in some embodiments, each of the low noise amplifiers 456, 444 and 412 have band pass filters at their input and/or output. Additionally, band pass filters can be used at each of the antennas 400, 402, 404 and 406. Based on the output of splitters 448 and low noise amplifier 456, thirty-six signals labeled RTN are frequency combined in MUX 450 which outputs 9 signals. The output of MUX 450 is provided to down converter 452. The output of down converter 452 is provided to channelizer 442. Each of the selection matrices 410, 414, 420, 422, 424, 426, 428, 443 and 454 includes switches that are used to switch throughput among the various spot beams in the hopping groups or among various bands from the gateways and high capacity steerable spot beams. The chosen signals are provided to channelizer 442 which is used to route spectrum between the uplinks and downlinks. In one embodiment, channelizer 442 is a digital channelizer that is fully programmable in orbit.

Channelizer 442 can be thought of as a large switching or routing matrix that is fully programmable. FIG. 4 shows that channelizer 442 provides fourteen outputs to upconverter 460, fourteen outputs to upconverter 472, eight outputs to upconverter 480, eight outputs to upconverter 490 and twenty outputs to upconverter 502. Note that upconverters 460, 472, 480 and 490 (all which function to increase the frequency of the signal) are provided as part of the forward path, while upconverter 502 is provided for the return path. The output of each of the 14 upconverters 460 are provided to filters 462. The output of each of the fourteen filters 462 are provided to solid state power amplifiers (S SPA) 464. The output of each of the fourteen SSPAs are provided to multiplexer 466. The output of multiplexer 466 is provided to 28:170 selection matrix 468. The 170 outputs of selection matrix 468 are provided as the one hundred and seventy non-Equatorial non-articulated beam hopping spot beams 470.

The output of the fourteen upconverters 472 are provided to separate filters 474. The output of each of the fourteen filters 474 is provided to separate SSPAs 476. The output of each of the fourteen SSPAs 476 are provided to multiplexer 478. The output of multiplexer 478 is provided to selection matrix 468. The output of the eight upconverters 480 are provided to filters 482. The output of the eight filters 482 are provided to separate SSPAs 484. The output of SSPAs 484 are provided to selection matrix 486. The output of selection matrix 486 is provided as the thirty Equatorial region non-articulated beam hopping spot beams of 488. Note that the SSPAs can be turned off (e.g., when the satellite is over the ocean or other non-inhabited area) to conserve power.

The output of upconverters 490 (which can be part of the forward path or the return path) are provided to filters 492. The output of the eight filters 492 are provided to SSPAs 494. The output of the eight SSPAs 494 are provided to selection matrix 496. The 12 output signals from selection matrix 496 are provided to multiplexer 498. The output of multiplexer 498 are provided as the six 2.8 degree gateway/high capacity subscriber terminals steerable spot beams, with dual polarization.

The output of upconverters 502 are provided to separate filters 504. The output of the twenty filters 504 are provided to separate SSPAs 506. The output of the 20 SSPAs 506 are provided to selection matrix 508, which provides 42 outputs. Twelve of the 42 outputs are provided to multiplexer 498, fourteen of the 42 outputs are provided to multiplexer 466 and multiplexer 478, and sixteen of the 42 outputs are provided as the eight gateway steerable dual polarization spot beams described above.

In an alternative embodiment, many or all of the selection matrices can be eliminated by having the selection/switching performed by channelizer 442. In some embodiments, the payload of FIG. 4 can be fully implemented by just a channelizer that will switch, route and filter. Such a channelizer may be configurable for a range of different conditions so that a generic channelizer may be configured for a given application. For example, a channelizer may be configurable to route a relatively large number of low-capacity communication channels or a relatively small number of high-capacity communication channels. Furthermore, such a channelizer may, in some cases, be configurable to implement a beamforming scheme, e.g., to provide outputs to phased array elements to produce a beam that is oriented in a particular direction. Such a channelizer may provide additional flexibility and may reduce the hardware complexity with respect to the baseline system.

Figure 5:
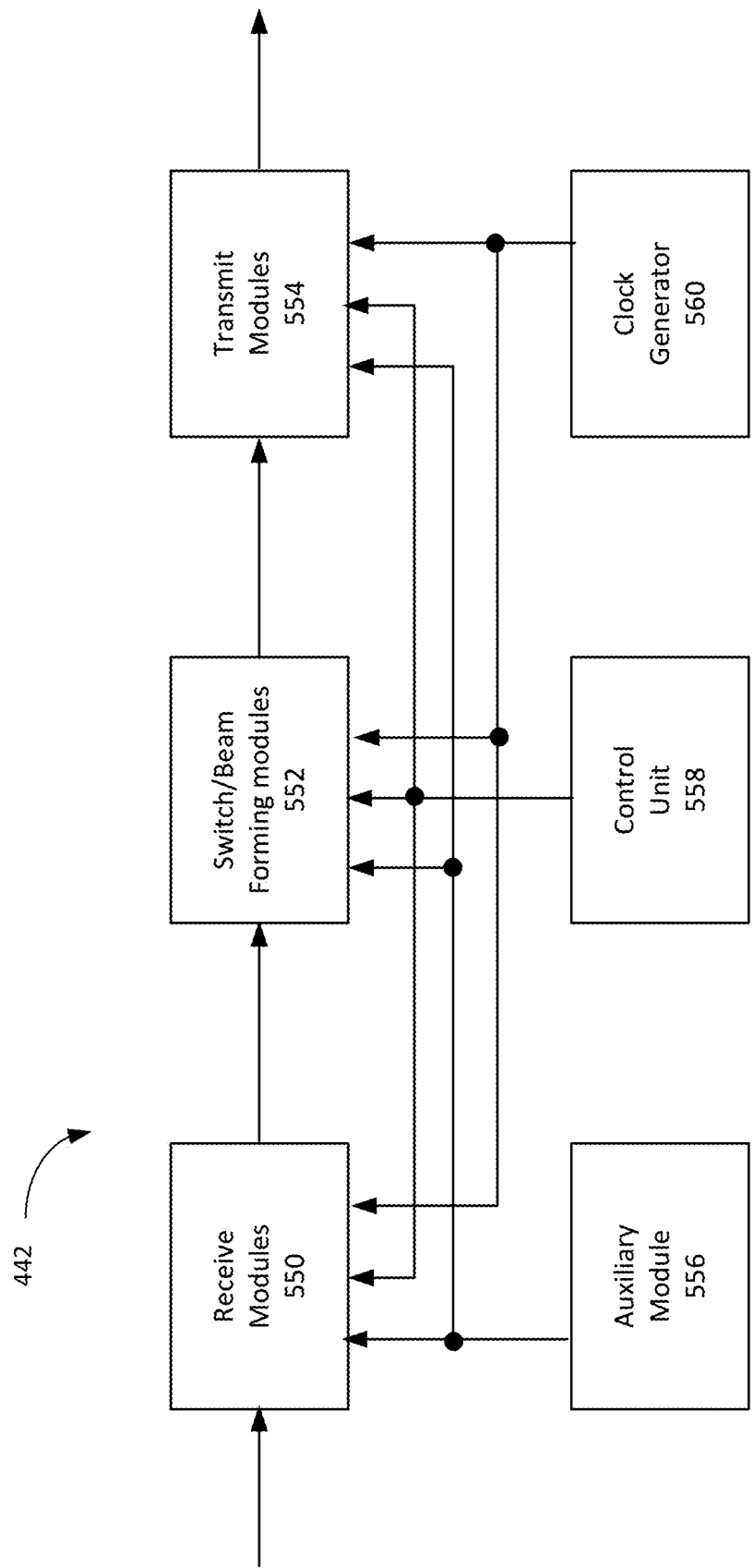
FIG. 5 illustrates an example of a digital channelizer.

FIG. 5 is a block diagram describing one example implementation of channelizer 442. The technologies described herein are not limited to any one particular architecture or implementation of channelizer 442. The embodiment of FIG. 5 is only one example that is suitable for the technology described herein and many other configurations are also usable. Inputs to channelizer 442 are provided to a receive module 550 (or "receive circuit"), where signals can be filtered, amplified, stored or simply received. The output of receive module 550 is provided to switch network and beam forming network 552. The output of switch network and beam forming network 552 is provided to a transmission module 554 which provides the outputs of channelizer 442. Channelizer 442 also includes an auxiliary module 556, control unit 558 and clock generator 560, which are all connected to receive module 550, switch network/beam forming network 552 and transmission module 554. In one embodiment, control unit 558 includes one or more processors used to program the switch networks/beam forming network 552. Clock generator 560 provides a clock signal to implement timing within channelizer 442. In one embodiment, auxiliary module 556 is used to control the switches of the switching network, adjust beams, provide spectrum analysis and provide uplink and downlink modems.

In general, electronic circuits generate heat as electrical current flows through devices (e.g., due to electrical resistance of electronic devices, wires, connectors, etc.). While some components may be optimized for particular parameters (e.g., for a particular frequency) other components may be configurable and may not be optimized when in use (e.g., amplifiers used across a range of different frequencies may be less efficient than amplifiers designed for a particular frequency). This may mean that configurable components (e.g., amplifiers) operate under less than optimal conditions, which may result in more heat than if they were operating under optimal conditions. Digital circuits such as those described above that are used in a satellite bus or payload may generate significant heat. Maintaining the temperature of such components and maintaining overall satellite temperature within acceptable limits may be challenging in space. Many electronic and other components operate effectively only within a particular temperature range and may fail outside that range. Therefore, removal of heat from heat-generating devices (e.g., any of the bus or payload components described above) may be important for satellite operation. Efficiently removing such heat may be challenging in conventional satellites.

FIG. 6 illustrates an example of satellite 201 that includes solar panels 660 and antennas 662 extending from a central body 664. In general, satellite bus and payload components may be located together in such a central body. In some cases, a central body may include one or more radiator panels to radiate heat generated by heat-generating components.

FIG. 7 shows an example of mounting of heat generating components in central body 664 of satellite 201. Heat-generating components 770, 771, 772 are attached to a first surface 704 of a radiator panel 706 so that heat generated in heat-generating components 770-772 can easily flow into radiator panel 706, where it is dispersed laterally and can be radiated into space from a second surface 708 of radiator panel 706 (as illustrated by wavey arrows).

FIG. 8 shows an example that includes a radiator panel on the north facing side 880 of central body 664. A central body may have a cubic shape with six sides and may have certain sides that are more suitable for radiating heat. For example, north facing side 880 and south facing side 881 may be suitable for radiating heat because they are generally not facing the sun so that any radiated heat from the sun hits them obliquely at a low angle and does not cause substantial heating. In an example, radiator panels are provided along surfaces of both north facing side 880 and south facing side 881. Other sides such as west facing side 882 or earth-facing side 884 may be subject to radiated heat from the sun at angles close to ninety degrees at certain times, which may cause significant heating and make these sides less suitable for radiator panels. While such a configuration is compact to allow it to be loaded in a launch vehicle, it has limited radiator panel area, which may make heat management difficult and may limit the heat-generating components that can be used.

In some cases, additional radiator panels that fold out from a central body such as central body 664 may be used. In order to convey heat from heat-generating components to such fold-out radiator panels, some fluid (coolant) may flow from a central body out to the fold-out radiator panels. This may be accomplished passively with loop heat pipe or may require a pump or other active device to ensure fluid flow over relatively long distances, which may require significant power and presents a risk of failure if the pump fails. In either event, transferring heat from the primary to deployed radiator panels generally results in building up temperature differentials between the panels due to the resistance from conductive heat transfer in transporting that heat. Couplings for cooling fluid may be required between the central body and the fold out panels, which may present additional failure modes.

In an example of the present technology, heat-generating components of a satellite are attached to two or more radiator panels that can extend when deployed. Because such fold-out panels have heat-generating components mounted on them, heat may flow directly from such components into the radiator panels on which they are mounted and from there into space so that heat flows relatively short distances. Circulation of coolant may be reduced or eliminated and active devices (e.g., pumps) may be unnecessary. Using passive elements reduces power usage, increases heat rejection efficiency, and reduces risk of failure from active devices and additional thermal interfaces.

FIGS. 9A-D show examples of satellites that implement aspects of the present technology to allow efficient management of heat generated by heat-generating components of a satellite in a reliable manner. The example satellites of FIGS. 9A-D may include any combination of satellite components (including heat-generating components) described in the previous drawings and/or additional components.

FIG. 9A illustrates a simplified example of a satellite 902 that includes a first section 904 and a second section 906 in a compact configuration in which first section 904 and second section 906 are overlapping (e.g., upper surface 908 of second section 906 is partially or completely covered by a lower surface of first section 904). This compact configuration may be used for satellite launch so that the dimensions of the satellite fit within a launch vehicle and in some cases may allow multiple satellites to be launched together from the same launch vehicle. Each section includes heat-generating satellite components and at least one radiator panel for disposing of heat produced by the heat-generating components when in use. FIG. 9A and subsequent figures are simplified for illustration, and it will be understood that additional satellite components that are not illustrated may be present in any suitable configuration (e.g., solar panels, antennas, thrusters).

FIG. 9B illustrates satellite 902 in a deployed or extended configuration in which first section 904 and second section 906 are non-overlapping so that surfaces of both sections are exposed. For example, as shown in FIG. 9B, upper surface 908 of first section 904 and upper surface 910 of second section 906 are exposed in this configuration. Upper surfaces 908, 910 face north in FIG. 9B and are unobscured to the north. Thus, radiator panels located along upper surfaces 908 and 910 can radiate heat efficiently (little or no effect from other section) in this configuration. Similarly, lower surfaces of first section 904 and second section 906 (not visible in this view) are exposed to the south and radiator panels located along such lower surfaces may radiate heat efficiently. This configuration approximately doubles the effective radiator panel area compared to satellite 664 of FIG. 8.

FIG. 9B shows an axis of rotation 912 extending north-south along corners of first section 904 and second section 906. Axis of rotation 912 may be an axis about which rotation of second section 906 with respect to first section 904 occurs during deployment. Suitable components (e.g., an axle, post or spindle and actuator such as a spring) may be provided to cause deployment at a desired time. Relative rotation of greater than 90 degrees may expose previously obscured surfaces. In some cases, relative rotation of more than 90 degrees may be applied (e.g., 180 degrees shown in FIG. 9B). In other examples, sections may be slidable relative to each other, sections may be hinged along their edges so that they fold out, or may deploy in any other suitable manner.

While two sections are shown in FIGS. 9A-B, the present technology is not limited to any particular number of sections and may include, for example, three, four, or more sections, each including heat-generating components and at least one radiator panel to dispose of heat from the heat-generating components.

FIGS. 9C-D illustrate an example of a satellite 920 that includes a third section 922 in addition to the first section 904 and second section 906 of FIGS. 9A-B. Third section 922 overlaps first and second sections 904, 906 in the compact configuration shown in FIG. 9C. A radiator panel may extend along one or more surfaces of third section 922 (e.g., along surface 924 and/or along an opposite surface, which is not visible in this view). In addition to axis of rotation 912 for relative rotation of first and sections 904, 906, FIG. 9C shows axis of rotation 926 for relative rotation of third and second sections 922, 906.

FIG. 9D shows first, second and third sections 904, 906, 922 in a deployed (extended) configuration after rotation of sections about axes of rotation 912, 926 from the compact configuration of FIG. 9C. In this configuration, first, second and third sections are non-overlapping. It can be seen that the north-facing surfaces 908, 910, 924 of first, second and third sections 904, 906, 922 respectively are exposed (unobscured) to the north so that any radiator panels along surfaces 908, 910, 924 may efficiently radiate heat. Similarly, south-facing surfaces (not visible in FIG. 9D) are exposed to the south so that any radiator panels along such surfaces may efficiently radiate heat.

In some cases, a satellite section (e.g., any one or more of sections 904, 906, 922 in any of the above examples) may have a single radiator panel on a single side (e.g., north-facing side) and heat-generating components in the section may be attached to that radiator panel so that all heat generated in the section is radiated into space by a single panel. In other examples, two radiator panels are provided in a section (e.g., any one or more of sections 904, 906, 922 in any of the above examples) so that heat can be radiated in two different directions (e.g., north and south), which may allow more heat to be managed per section without significantly increasing size. Heat-generating components may be sandwiched between such radiator panels so that heat travels only short distances before being radiated into space.

Figure 10A:
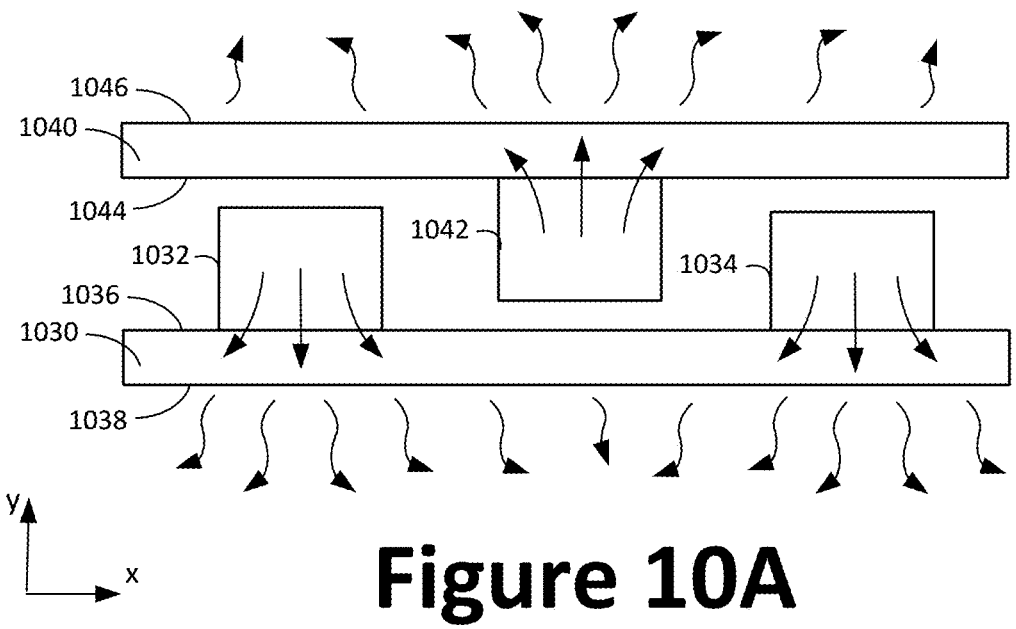
FIGS. 10A-B show examples of structures of sections of a fold-out satellite.

FIG. 10A shows a first example of part of a satellite section (e.g., any one or more of sections 904, 906, 922 in any of the above examples) in cross section. A first radiator panel 1030 receives heat from first heat-generating components 1032, 1034 and radiates heat into space. First heat-generating components 1032, 1034 are attached to a first surface 1036 of first radiator panel 1030 and heat is radiated from a second surface 1038 of first radiator panel 1030.

A second radiator panel 1040 extends parallel to first radiator panel 1030. Relative positions of first radiator panel 1030 and second radiator panel 1040 may be fixed so that they remain in the configuration shown (parallel, a fixed distance apart) when sections of a satellite are deployed. For example, posts, bolts, brackets, or other components may be used to fix the relative locations of first radiator panel 1030 with respect to second radiator panel 1040. A second heat-generating component 1042 is attached to a first surface 1044 of second radiator panel 1040 and heat is radiated from a second surface 1046 of second radiator panel 1040. Offsetting locations of first heat-generating components 1032, 1034 and second heat-generating component 1042 allows heat-generating components to be closely packed thereby reducing size, while providing radiator panels above and below (in this view) provides a high capacity for dissipating and radiating heat to accommodate significant heat generated by such components. For example, where a satellite is oriented so that the y-direction shown is north, first radiator panel 1030 radiates heat to the south while second radiator panel 1040 radiates heat to the north.

Figure 10B:
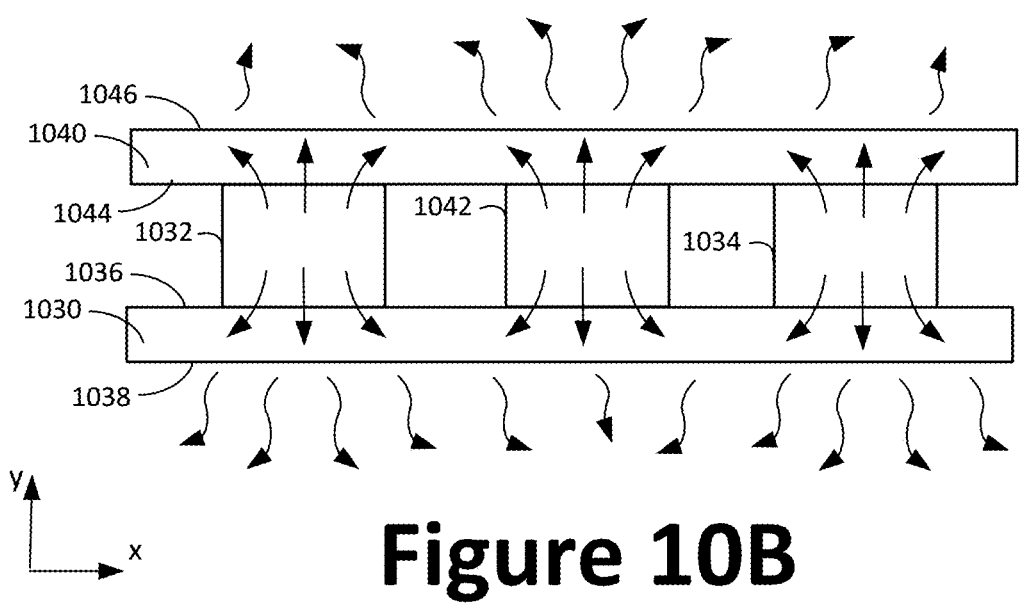

FIG. 10B illustrates an alternative arrangement to that of FIG. 10A in which heat-generating components 1032, 1034, 1042 are each attached to two radiator panels so that heat from each heat-generating component can move along two opposite pathways (e.g., along the positive y-direction or negative y-direction, which may correspond to north and south when satellite is in operation). Such opposite-facing pairs of radiator panels may allow heat dissipation through one radiator panel when the other radiator panel is not operating optimally (e.g., when one panel has incident solar radiation because of the satellite section's orientation, the other panel is shaded from solar radiation and can operate efficiently). In examples shown in both FIGS. 10A and 10B heat-generating components are sandwiched between two radiator panels in a fixed position (relative to each other) that allows efficient heat dissipation from heat-generating components. In some cases, a satellite section may include a mix of configurations with some heat-generating components attached to a single radiator panel and others attached to two radiator panels.

Heat-generating components may be mounted to radiator panels (in this and any other examples described here) so that heat flows easily from heat-generating components into radiator panels. Thermally conductive material may be used to ensure good thermal flow. In general, heat flows relatively short distances in such a sandwich arrangement so that active components (e.g., pumps for coolant) may not be necessary which provides reliability and power-consumption benefits. In some cases, little or no heat transfer may occur between satellite sections and each section may include radiator panels with sufficient area to radiate all heat generated in that section. By managing heat generated in each section internally (within the section), coolant flow between sections is unnecessary and complexity and weight are reduced.

Figure 11A:
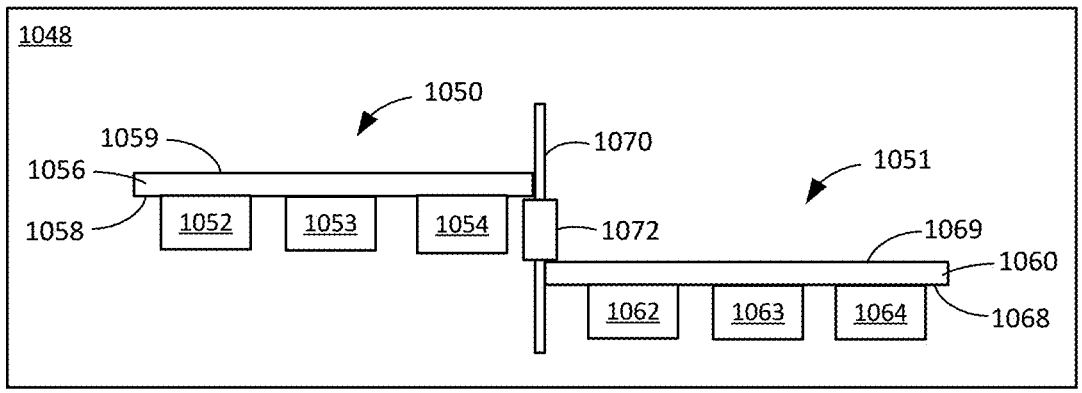
FIGS. 11A-B show examples of satellites with two sections.

Any of the radiator panel configurations described above (e.g., in FIGS. 7, 10A and 10B) may be used in one or more sections of a multi-section satellite (e.g., as illustrated in FIGS. 9A-D). FIG. 11 illustrates an example of a satellite 1048 that includes a first section 1050 and a second section 1051. First section 1050 includes a first radiator panel 1056 with first heat-generating components 1052-1054 attached to a first surface 1058 so that generated heat is radiated from second surface 1059. Second section 1051 includes a second radiator panel 1060 with second heat-generating components 1062-1063 attached to a first surface 1068 so that generated heat is radiated from second surface 1069. First and second radiator panels 1056, 1060 are attached to a spindle or post 1070 so to allow relative rotation (e.g., at least one of them is rotatable about post 1070). Actuator 1072 provides a rotational force to deploy first and second radiator panels 1056, 1060 from the compact (stacked, or folded) configuration in which they are overlapping (e.g., as shown in FIG. 9A) to a deployed configuration in which the first and second radiator panels 1056, 1060 are non-overlapping (e.g., as shown in FIGS. 9B and 11A). Actuator 1072 may include one or more springs, electromagnetic elements, or other suitable actuators. First radiator panel 1056 may have sufficient area to radiate all heat generated by heat-generating components 1152-1154 when in space. Second radiator panel 1060 may have sufficient area to radiate all heat generated by heat-generating components 1062-1064 when in space.

Figure 11B:
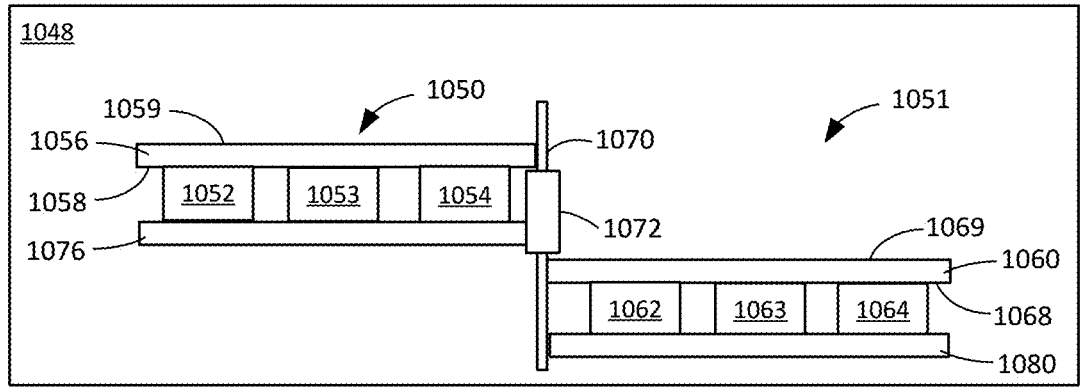

FIG. 11B shows an alternative arrangement of satellite 1048 to that of FIG. 11A in which heat-generating components are sandwiched between radiator panels. In addition to first and second radiator panels 1056, 1060, FIG. 11B shows third radiator panel 1076 that is in a fixed parallel configuration with respect to first radiator panel 1056 such that first heat-generating components 1052-1054 are located between the first and third radiator panels 1056, 1076. The first heat-generating components 1052-1054 are attached to third radiator panel 1076 (in addition to first radiator panel 1056) to enable dissipation of heat from the first heat-generating components 1052-1054 to both the first radiator panel 1056 and the third radiator panel 1076 (e.g., as previously described with respect to FIG. 10B). FIG. 11B also shows a fourth radiator panel 1080 that is in a fixed parallel configuration with respect to second radiator panel 1060 such that second heat-generating components 1062-1064 are located between the second and fourth radiator panels 1060, 1080. The second heat-generating components 1062-1064 are attached to fourth radiator panel 1080 (in addition to second radiator panel 1060) to enable dissipation of heat from the second heat-generating components 1062-1064 to both the second radiator panel 1060 and the fourth radiator panel 1080 (e.g., as previously described with respect to FIG. 10B). Alternatively, heat-generating components may be located between radiator panels but may each be attached to only one radiator panel (e.g., as illustrated in FIG. 10A).

Heat-generating components may be distributed between different sections of a satellite in any manner. In one example, bus components are located in one section and payload components are located in another section or sections. For example, first heat-generating components 1052-1054 may be bus components while second heat-generating components 1062-1064 may be payload components. Suitable electrical connections may be provided between sections to allow power delivery (e.g., from a bus to a payload) and communication.

FIG. 12A shows a satellite 1200 that includes first and second sections 1050, 1051 and additionally includes a third section 1210. Third section 1210 includes third heat-generating components 1282-1284 attached to a first surface 1258 so that generated heat is radiated from second surface 1259. Second and third radiator panels 1060, 1256 are attached to a spindle or post 1270 so to allow relative rotation (e.g., at least one of them is rotatable about post 1270). Actuator 1272 provides a rotational force to deploy second and third radiator panels 1060, 1256 from the compact configuration in which they are overlapping (e.g., as shown in FIG. 9C) to a deployed configuration in which the second and third radiator panels 1060, 1256 are non-overlapping (e.g., as shown in FIGS. 9D and 12A). Deployment of multiple sections may occur at the same time (e.g., first section 1050 and third section 1210 may rotate with respect to second section 1051 at the same time) or may occur separately (e.g., first section 1050 may deploy first followed by third section 1210).

FIG. 12B shows an alternative arrangement of satellite 1200 to that of FIG. 12A in which heat-generating components are sandwiched between radiator panels. In addition to first, second and third radiator panels 1056, 1060, 1256, FIG. 12B shows radiator panel 1076 that is in a fixed parallel configuration with respect to first radiator panel 1056, radiator panel that is in a fixed parallel configuration with respect to second radiator panel 1060, and radiator panel 1276 (sixth radiator panel in this example) that is in a fixed parallel configuration with respect to third radiator panel 1256. The third heat-generating components 1282-1284 are attached to sixth radiator panel 1276 (in addition to third radiator panel 1256) to enable dissipation of heat from the third heat-generating components 1282-1284 to both the third radiator panel 1256 and the sixth radiator panel 1276 (e.g., as previously described with respect to FIG. 10B). Alternatively, heat-generating components may be located between radiator panels substantially as shown but may each be attached to only one radiator panel (e.g., as illustrated in FIG. 10A). For example, fourth heat-generating components may be attached to fourth radiator panel 1076, fifth heat-generating components may be attached to fifth radiator panel 1080 and sixth heat-generating components may be attached to sixth radiator panel 1276.

While the examples of FIGS. 11A-12B include two and three sections respectively, it will be understood that the present technology is not limited to these examples and that four, five, six, or more sections may be similarly configured so that they can deploy from a compact configuration to a deployed configuration. Increasing the number of sections may provide a larger radiator area for a given satellite volume. Additional heat-generating components may be accommodated in additional satellite sections that each have one or more additional radiator panel. Each section of a satellite may be similar (e.g., as shown in FIGS. 12A-B) or may be different. For example, one section may have a single radiator panel (as in FIG. 12A) while another radiator panel may have two radiator panels (as in FIG. 12B). One or more section may contain satellite bus components while another one or more section may contain satellite payload components (e.g., section 1051 may include all bus components while sections 1050 and 1210 may include all payload components).

Figure 13:
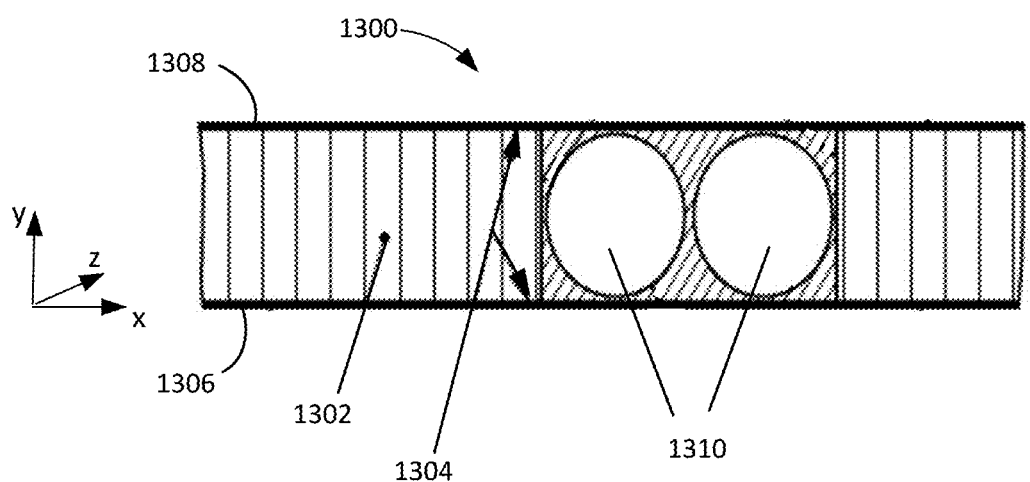
FIG. 13 shows an example of a radiator panel in cross section.

Radiator panels may be formed of any suitable material and may have any suitable structure for enabling heat flow from heat-generating components and for radiating the heat into space. FIG. 13 shows an example of a portion of a radiator panel 1300 (e.g., any of the radiator panels of the above examples) in cross section along the x-y plane. Radiator panel 1300 includes a honeycomb structure 1302 (e.g., formed of Aluminum with cavities) that extends between outer layers 1304. Heat-generating components may be attached to a first surface 1306 so that heat is transferred through honeycomb structure 1302 and outer layers 1304 and is radiated from second surface 1308. Two heat pipes 1310 (e.g., constant conduction heat pipes) are shown in cross section in FIG. 13. Heat pipes 1310 may be filled with ammonia or other coolant so that heat may travel laterally (along the x-z plane). This moves heat away from heat-generating components and distributes heat evenly across radiator panel 1300 to be radiated into space. While one or more pumps may be provided to move such coolant in some examples, passive methods may be sufficient to move such coolant over relatively short distances (e.g., within a single radiator panel) so that pumps may not be necessary. Heat-generating components may be attached to radiator panels (e.g., radiator panel 1300) using a thermally conductive material so that heat can easily flow from such heat-generating components into radiator panels.

Heat-generating components may be combined with radiator panels so that each radiator panel (or pair of opposing radiator panels) has sufficient area to radiate heat from all heat-generating components attached to it (or them). In this way, heat may be independently managed in each section of a satellite so that no coolant flow between sections is required. In other examples, coolant flow between sections may be used for combined heat management. In some cases, additional radiator panels may be added that do not have heat-generating components attached to them (e.g., fold-out radiator panels to increase area).

Figure 14A:
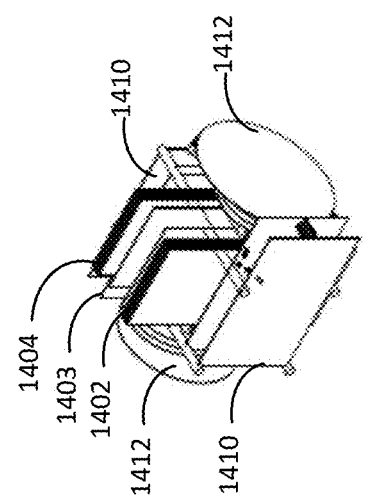
FIGS. 14A and 14B show a satellite in a compact configuration and deployed configuration respectively.
Figure 14B:
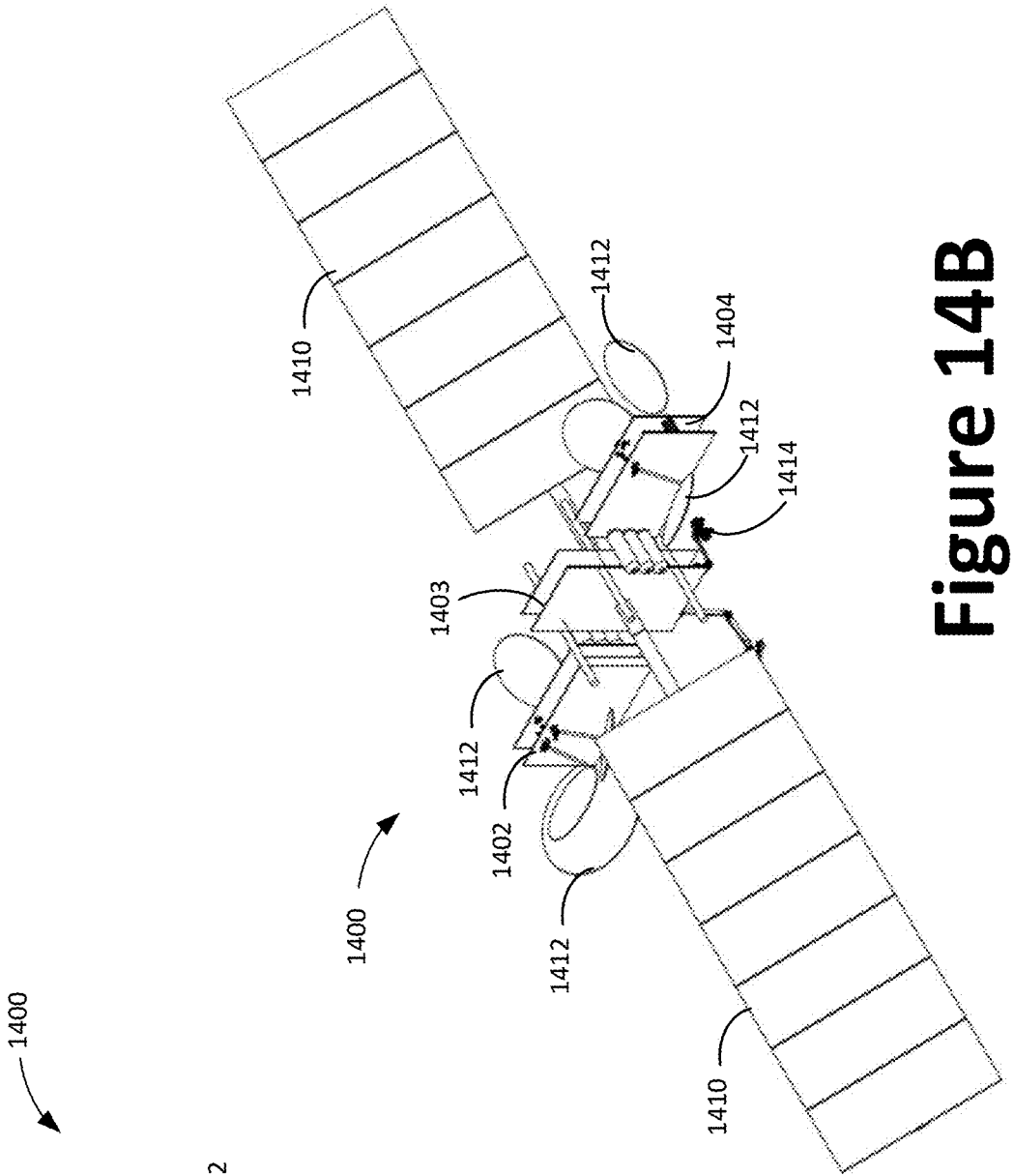

FIGS. 14A-B show an example of a satellite 1400 that is formed of three satellite sections 1402, 1403, 1404 that can be folded into a compact configuration and subsequently unfolded (deployed) to a deployed configuration for use in space. Each section has heat-generating components sandwiched between a pair of radiator panels (e.g., as shown in FIGS. 10A-B, 11B and 12B) so that each section independently disposes of heat that it generates. Satellite 1400 also includes solar panels 1410 and antennas 1412 that are folded in the compact configuration and are unfolded in a deployed configuration.

FIG. 14A shows satellite 1400 in the compact configuration with satellite sections 1402-1404 folded so that they overlap. Solar panels 1410 and antennas 1412 are also folded in this configuration. Satellite 1400 may occupy a compact space in this configuration (e.g., in a 5 meter payload fairing) for launching from a launch vehicle. After satellite 1400 is released from the launch vehicle and is in orbit it may be reconfigured for operation.

FIG. 14B shows satellite 1400 in the deployed configuration with satellite sections 1402-1404 unfolded so that they do not overlap, thus exposing radiator panels for efficient heat radiation. Satellite 1400 may be oriented so that radiator panels of satellite sections 1402-1404 (which are parallel) face north or south (e.g., each satellite section includes a pair of radiator panels, one radiator panel facing north and another radiator panel facing south). Solar panels 1410 are also unfolded in this configuration so that a large area of solar panels is exposed to solar radiation. Satellite 1400 may be oriented so that the angle of incidence of solar radiation on solar panels 1410 is normal or near normal in this configuration to capture sufficient radiated energy. Antennas 1412 are unfolded in this configuration and each antenna may be directed at a selected target (e.g., subscriber terminals, gateway, another satellite, or other target). One or more thruster 1414 is provided to allow satellite 1400 to be oriented and repositioned as needed. The number and arrangement of solar panels, antennas, thrusters and other components may vary depending on design and the present technology is not limited to any particular number or arrangement.

An example of a satellite includes a first radiator panel having one or more first heat-generating components attached to a first surface and a second radiator panel having one or more second heat-generating components attached to a first surface. The satellite includes one or more actuators configured to deploy the first and second radiator panels from a compact configuration in which the first and second radiator panels are overlapping to a deployed configuration in which the first and second radiator panels are non-overlapping.

The first radiator panel may have sufficient area to radiate all heat generated by the first heat-generating components attached to the first surface of the first radiator panel when in space and the second radiator panel may have sufficient area to radiate all heat generated by the second heat-generating components attached to the first surface of the second radiator panel when in space. The satellite may include a third radiator panel that is in a fixed parallel configuration with respect to the first radiator panel such that the first heat-generating components are located between the first and third radiator panels. The first heat-generating components may be additionally attached to a first surface of the third radiator panel to enable dissipation of heat from the first heat-generating components to both the first and third radiator panels. The satellite may include one or more third heat-generating components attached to a first surface of the third radiator panel. The satellite may include a fourth radiator panel that is in fixed parallel configuration with respect to the second radiator panel such that the second heat-generating components are located between the second and the fourth radiator panels. The first heat-generating components may be satellite bus components and the second heat-generating components may be satellite payload components. The satellite may include a third radiator panel having one or more third heat-generating components attached to a first surface, the third radiator panel is deployable with the first and second radiator panel from the compact configuration in which the first, second and third radiator panels are substantially overlapping to the deployed configuration in which the first, second and third radiator panels are substantially non-overlapping. The first, second and third radiator panels each may have a second surface for heat radiation and the second surfaces of the first, second and third radiator panels may have substantially the same orientation in the deployed configuration. The satellite may further include one or more additional radiator panels having one or more additional heat-generating components attached to a first surface, the one or more additional radiator panels is deployable with the first, second and third radiator panels from the compact configuration in which the first, second, third and additional radiator panels are substantially overlapping to the deployed configuration in which the first, second, third and additional radiator panels are substantially non-overlapping. The first and second radiator panels may be formed of aluminum and include heat pipes extending parallel to the first surface.

An example of an apparatus includes: a first radiator panel extending along a first plane, the first radiator panel having a first surface and a second surface parallel to the first plane, the second surface for radiating heat from one or more first heat-generating components attached to the first surface of the first radiator panel; a second radiator panel extending along a second plane, the second radiator panel having a first surface and a second surface parallel to the second plane, the second surface for radiating heat from one or more second heat-generating components attached to the first surface of the second radiator panel; a third radiator panel extending along a third plane, the third radiator panel having a first surface and a second surface parallel to the third plane, the second surface for radiating heat from one or more third heat-generating components attached to the first surface of the third radiator panel; and one or more actuators configured to deploy the first, second and third radiator panels from a compact configuration in which the first, second and third radiator panels overlap to a deployed configuration in which the first, second and third radiator panels extend such that the second surface of each of the first, second and third radiator panels are unobscured by other radiator panels.

The apparatus may further include: a fourth radiator panel having a fixed position with respect to the first radiator panel, the fourth radiator panel having a first surface and a second surface parallel to the first plane, the second surface for radiating heat from the one or more first heat-generating components that are attached to the first surface of the fourth radiator panel; a fifth radiator panel having a fixed position with respect to the second radiator panel, the fifth radiator panel having a first surface and a second surface parallel to the second plane, the second surface for radiating heat from the one or more second heat-generating components that are attached to the first surface of the fifth radiator panel; and a sixth radiator panel having a fixed position with respect to the third radiator panel, the sixth radiator panel having a first surface and a second surface parallel to the third plane, the second surface for radiating heat from the one or more third heat-generating components that are attached to the first surface of the fifth radiator panel. The first heat-generating components may be located between first surfaces of the first and fourth radiator panels and may be attached with thermally conductive material to the first surfaces of the first and fourth radiator panels; the second heat-generating components may be located between first surfaces of the second and fifth radiator panels and may be attached with thermally conductive material to the first surfaces of the second and fifth radiator panels; and the third heat-generating components may be located between first surfaces of the third and sixth radiator panels and may be attached with thermally conductive material to the first surfaces of the third and sixth radiator panels. The apparatus may further include: a fourth radiator panel having a fixed position with respect to the first radiator panel, the fourth radiator panel having a first surface and a second surface parallel to the first plane, the second surface for radiating heat from one or more fourth heat-generating components that are attached to the first surface of the fourth radiator panel; a fifth radiator panel having a fixed position with respect to the second radiator panel, the fifth radiator panel having a first surface and a second surface parallel to the second plane, the second surface for radiating heat from one or more fifth heat-generating components that are attached to the first surface of the fifth radiator panel; and a sixth radiator panel having a fixed position with respect to the third radiator panel, the sixth radiator panel having a first surface and a second surface parallel to the third plane, the second surface for radiating heat from one or more sixth heat-generating components that are attached to the first surface of the fifth radiator panel. The first heat-generating components may include satellite bus components including at least one of: a processor; a telemetry, command and ranging communication and processing circuit; and a power controller; and the second and third heat-generating components may include satellite payload components including at least one of: an amplifier and a digital channelizer. The first, second and third radiator panels may be formed of aluminum and each radiator panel may include one or more heat pipes.

An example of a satellite includes: a first radiator panel extending along a first plane, the first radiator panel having a first surface and a second surface parallel to the first plane, the second surface for radiating heat from one or more first heat-generating components attached to the first surface of the first radiator panel; a second radiator panel extending along a second plane, the second radiator panel having a first surface and a second surface parallel to the second plane, the second surface for radiating heat from one or more second heat-generating components attached to the first surface of the second radiator panel; a third radiator panel extending along a third plane, the third radiator panel having a first surface and a second surface parallel to the third plane, the second surface for radiating heat from one or more third heat-generating components attached to the first surface of the third radiator panel; a fourth radiator panel having a fixed position with respect to the first radiator panel, the first heat-generating components attached to a first surface of the fourth radiator panel to form a first satellite section that includes the first heat-generating components sandwiched between the first and fourth radiator panels; a fifth radiator panel having a fixed position with respect to the second radiator panel, the second heat-generating components attached to a first surface of the fifth radiator panel to form a second satellite section that includes the second heat-generating components sandwiched between the second and fifth radiator panels; a sixth radiator panel having a fixed position with respect to the third radiator panel, the third heat-generating components attached do a first surface of the sixth radiator panel to form a third satellite section that includes the third heat-generating components sandwiched between the third and sixth radiator panels; and one or more actuators configured to deploy the first, second and third satellite sections from a compact configuration in which the first, second and third satellite sections overlap to a deployed configuration in which the first, second and third satellite sections are not overlapping.

The first heat-generating component may be satellite bus components including a processor and a power controller and the second and third heat-generating components may be satellite payload components including an amplifier and a digital channelizer. The satellite may include one or more solar panels and one or more antennas that are folded in the compact configuration and unfolded in the deployed configuration.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of be defined by the claims appended hereto.

What is claimed is:

1. A satellite comprising:
a first radiator panel having one or more first heat-generating components mounted on a first surface;
a second radiator panel having one or more second heat-generating components mounted on a first surface;
a third radiator panel having one or more third heat-generating components mounted on a first surface; and
two or more actuators configured to deploy the first, second and third radiator panels from a compact configuration in which the first, second and third radiator panels are overlapping to a deployed configuration in which the first, second and third radiator panels are non-overlapping and the first surfaces of the first, second and third radiator panels are parallel in the compact configuration, in the deployed configuration and during deployment from the compact configuration to the deployed configuration.

2. The satellite of claim 1 wherein the first radiator panel has a first area to radiate all heat generated by the one or more first heat-generating components attached to the first surface of the first radiator panel when in space and the second radiator panel has a second area to radiate all heat generated by the one or more second heat-generating components attached to the first surface of the second radiator panel when in space.

3. The satellite of claim 1 further comprising a fourth radiator panel that is in a fixed parallel configuration with respect to the first radiator panel such that the one or more first heat-generating components are located between the first and fourth radiator panels.

4. The satellite of claim 3 wherein the one or more first heat-generating components are additionally attached to a first surface of the fourth radiator panel to enable dissipation of heat from the one or more first heat-generating components to both the first and fourth radiator panels.

5. The satellite of claim 3 further comprising one or more fourth heat-generating components attached to a first surface of the fourth radiator panel.

6. The satellite of claim 3 further comprising a fifth radiator panel that is in fixed parallel configuration with respect to the second radiator panel such that the one or more second heat-generating components are located between the second and the fifth radiator panels.

7. The satellite of claim 1 wherein the one or more first heat-generating components are satellite bus components and the one or more second heat-generating components are satellite payload components.

8. The satellite of claim 1, wherein the two or more actuators include a first actuator configured to rotate the first radiator panel with respect to the second radiator panel and a second actuator configured to rotate the second radiator panel with respect to the third radiator panel.

9. The satellite of claim 1 further comprising:
one or more additional radiator panels having one or more additional heat-generating components attached to a first surface, the one or more additional radiator panels is deployable with the first, second and third radiator panels from the compact configuration in which the first, second, third and the one or more additional radiator panels are substantially overlapping to the deployed configuration in which the first, second, third and the one or more additional radiator panels are substantially non-overlapping.

10. The satellite of claim 1 wherein the first, second and third radiator panels are formed of aluminum and include heat pipes extending parallel to the first surface.

11. An apparatus comprising:
a first radiator panel extending along a first plane, the first radiator panel having a first surface and a second surface parallel to the first plane;
one or more first heat-generating components directly attached to the first surface of the first radiator panel;
a second radiator panel extending along a second plane, the second radiator panel having a first surface and a second surface parallel to the second plane;
one or more second heat-generating components directly attached to the first surface of the second radiator panel;
a third radiator panel extending along a third plane, the third radiator panel having a first surface and a second surface parallel to the third plane;
one or more third heat-generating components directly attached to the first surface of the third radiator panel;
two or more actuators configured to deploy the first, second and third radiator panels from a compact configuration in which the first, second and third radiator panels overlap to a deployed configuration in which the first, second and third radiator panels extend such that the second surface of each of the first, second and third radiator panels are unobscured by other radiator panels; and
wherein the first surfaces of the first, second and third radiator panels are parallel in the compact configuration, in the deployed configuration and during deployment from the compact configuration to the deployed configuration.

12. The apparatus of claim 11 further comprising:
a fourth radiator panel having a fixed position with respect to the first radiator panel, the fourth radiator panel having a first surface and a second surface parallel to the first plane, the one or more first heat-generating components are directly attached to the first surface of the fourth radiator panel;
a fifth radiator panel having a fixed position with respect to the second radiator panel, the fifth radiator panel having a first surface and a second surface parallel to the second plane, the one or more second heat-generating components that are directly attached to the first surface of the fifth radiator panel; and
a sixth radiator panel having a fixed position with respect to the third radiator panel, the sixth radiator panel having a first surface and a second surface parallel to the third plane, the one or more third heat-generating components are directly attached to the first surface of the fifth radiator panel.

13. The apparatus of claim 12 wherein:
the one or more first heat-generating components are located between first surfaces of the first and fourth radiator panels and are directly attached to the first surfaces of the first and fourth radiator panels;
the one or more second heat-generating components are located between first surfaces of the second and fifth radiator panels and are directly attached to the first surfaces of the second and fifth radiator panels; and
the one or more third heat-generating components are located between first surfaces of the third and sixth radiator panels and are directly attached to the first surfaces of the third and sixth radiator panels.

14. The apparatus of claim 11 further comprising:
a fourth radiator panel having a fixed position with respect to the first radiator panel, the fourth radiator panel having a first surface and a second surface parallel to the first plane;
one or more fourth heat-generating components that are directly attached to the first surface of the fourth radiator panel;
a fifth radiator panel having a fixed position with respect to the second radiator panel, the fifth radiator panel having a first surface and a second surface parallel to the second plane;
one or more fifth heat-generating components that are attached to the first surface of the fifth radiator panel;
a sixth radiator panel having a fixed position with respect to the third radiator panel, the sixth radiator panel having a first surface and a second surface parallel to the third plane; and
one or more sixth heat-generating components that are attached to the first surface of the sixth radiator panel.

15. The apparatus of claim 11 wherein:
the one or more first heat-generating components include satellite bus components including at least one of: a processor; a telemetry, command and ranging communication and processing circuit; and a power controller; and
the one or more second and third heat-generating components include satellite payload components including at least one of: an amplifier and a digital channelizer.

16. The apparatus of claim 11 wherein the first, second and third radiator panels are formed of aluminum and each radiator panel includes one or more heat pipes.

17. The satellite of claim 11, wherein the first, second and third radiator panels are configured to be deployed from the compact configuration to the deployed configuration by rotating the second radiator panel with respect to the first radiator panel about a first axis and rotating the third radiator panel with respect to the second radiator panel about a second axis, the first and second axes are perpendicular to the first, second and third radiator panels.

18. A satellite comprising:
a first radiator panel extending along a first plane, the first radiator panel having a first surface and a second surface parallel to the first plane, the second surface configured to radiate heat from one or more first heat-generating components mounted on the first surface of the first radiator panel;
a second radiator panel extending along a second plane, the second radiator panel having a first surface and a second surface parallel to the second plane, the second surface configured to radiate heat from one or more second heat-generating components mounted on the first surface of the second radiator panel;
a third radiator panel extending along a third plane, the third radiator panel having a first surface and a second surface parallel to the third plane, the second surface configured to radiate heat from one or more third heat-generating components mounted on the first surface of the third radiator panel;
a fourth radiator panel having a fixed position with respect to the first radiator panel, the first heat-generating components mounted on a first surface of the fourth radiator panel to form a first satellite section that includes the one or more first heat-generating components sandwiched between the first and fourth radiator panels;
a fifth radiator panel having a fixed position with respect to the second radiator panel, the second heat-generating components mounted on a first surface of the fifth radiator panel to form a second satellite section that includes the one or more second heat-generating components sandwiched between the second and fifth radiator panels;
a sixth radiator panel having a fixed position with respect to the third radiator panel, the third heat-generating components mounted on a first surface of the sixth radiator panel to form a third satellite section that includes the one or more third heat-generating components sandwiched between the third and sixth radiator panels; and
two or more actuators configured to deploy the first, second and third satellite sections from a compact configuration in which the first, second and third satellite sections overlap to a deployed configuration in which the first, second and third satellite sections are not overlapping and the first surfaces of the first, second, third, fourth, fifth and sixth radiator panels are parallel in the compact configuration, in the deployed configuration and during deployment from the compact configuration to the deployed configuration.

19. The satellite of claim 18 wherein the one or more first heat-generating components are satellite bus components including a processor and a power controller and the one or more second and the one or more third heat-generating components are satellite payload components including an amplifier and a digital channelizer.

20. The satellite of claim 18 further comprising:
one or more solar panels; and
one or more antennas that are folded in the compact configuration and unfolded in the deployed configuration.

* * * * *

UNITED STATES PATENT AND TRADEMARK OFFICE
CERTIFICATE OF CORRECTION

PATENT NO. : 12,227,313 B2
APPLICATION NO. : 17/538161
DATED : February 18, 2025
INVENTOR(S) : Freestone et al.

Page 1 of 1

It is certified that error appears in the above-identified patent and that said Letters Patent is hereby corrected as shown below:

In the Claims

Column 20, Line 47 (Claim 12, Line 12), please change "components that are" to -- components are --.
Column 21, Line 27 (Claim 15, Line 7), please change "and third" to -- and the one or more third --.

Signed and Sealed this
Twenty-fourth Day of June, 2025

Coke Morgan Stewart
*Acting Director of the United States Patent and Trademark Office*